United States Patent
Tsunemi et al.

(10) Patent No.: US 10,509,867 B2
(45) Date of Patent: Dec. 17, 2019

(54) STRUCTURE DESIGN SUPPORT DEVICE, STRUCTURE DESIGN SUPPORT METHOD, PROGRAM, AND RECORDING MEDIUM

(71) Applicant: NIPPON STEEL & SUMITOMO METAL CORPORATION, Tokyo (JP)

(72) Inventors: Yusuke Tsunemi, Chiba (JP); Takeshi Kawachi, Kisarazu (JP); Atsushi Yamazaki, Futtsu (JP)

(73) Assignee: NIPPON STEEL CORPORATION, Tokyo (JP)

( * ) Notice: Subject to any disclaimer, the term of this patent is extended or adjusted under 35 U.S.C. 154(b) by 292 days.

(21) Appl. No.: 15/500,241

(22) PCT Filed: Aug. 21, 2015

(86) PCT No.: PCT/JP2015/073527
§ 371 (c)(1),
(2) Date: Jan. 30, 2017

(87) PCT Pub. No.: WO2016/027887
PCT Pub. Date: Feb. 25, 2016

(65) Prior Publication Data
US 2017/0270226 A1 Sep. 21, 2017

(30) Foreign Application Priority Data

Aug. 21, 2014 (JP) .................. 2014-168284
Jun. 30, 2015 (JP) .................. 2015-131114

(51) Int. Cl.
*G06F 17/50* (2006.01)
(52) U.S. Cl.
CPC ...... *G06F 17/5004* (2013.01); *G06F 17/5018* (2013.01); *G06F 17/5095* (2013.01)

(58) Field of Classification Search
CPC ............ G06F 17/5004; G06F 17/5018; G06F 17/5095
See application file for complete search history.

(56) References Cited

U.S. PATENT DOCUMENTS

2004/0262365 A1* 12/2004 Kobayashi .............. B23K 11/11
228/103
2008/0312882 A1* 12/2008 Kumagai ............ G06F 17/5018
703/1

(Continued)

FOREIGN PATENT DOCUMENTS

CN 1383518 A 12/2002
CN 101495251 A 7/2009

(Continued)

OTHER PUBLICATIONS

G. Glinka et al, Stress Data for Fatigue Analysis of Welded Structures Welding in the World, Le Soudage Dans Le Monde • Jul. 2013 (Year: 2013).*

(Continued)

*Primary Examiner* — Jay Hann
*Assistant Examiner* — Chuen-Meei Gan
(74) *Attorney, Agent, or Firm* — Birch, Stewart, Kolasch & Birch, LLP

(57) ABSTRACT

A structure design support device includes: an evaluation point information acquisition unit which acquires evaluation point information representing a position in a first state and a position in a second state, of an evaluation point provided in a structure which is configured of a plurality of parts, and a part to which the evaluation point belongs, among the plurality of parts; and an evaluation value calculation unit which calculates an evaluation value representing the magnitude of a change between the first state and the second state, of a positional relationship between a first evaluation point belonging to a first part and a second evaluation point (Continued)

belonging to a second part different from the first part to which the first evaluation point belongs, by using the evaluation point information acquired in the evaluation point information acquisition unit.

28 Claims, 15 Drawing Sheets

(56) References Cited

U.S. PATENT DOCUMENTS

| | | | | |
|---|---|---|---|---|
| 2010/0131256 A1* | 5/2010 | Hallquist | ............... | B23K 11/34 703/8 |
| 2010/0241366 A1 | 9/2010 | Nonomura et al. | | |
| 2012/0267919 A1* | 10/2012 | Yoshida | ................... | B21D 7/08 296/205 |
| 2013/0000415 A1* | 1/2013 | Yoshida | .................. | B23K 11/11 73/827 |

FOREIGN PATENT DOCUMENTS

| | | |
|---|---|---|
| EP | 1315105 A1 | 5/2003 |
| JP | 2002-35986 A | 2/2002 |
| JP | 2011-221644 A | 11/2011 |
| JP | 2013-92835 A | 5/2013 |
| JP | 2013-182447 A | 9/2013 |
| JP | 5440415 B2 | 3/2014 |

OTHER PUBLICATIONS

Japanese Notice of Allowance, dated Dec. 19, 2017, for corresponding Japanese Application No. 2016-544267, with an English translation.
International Search Report for PCT/JP2015/073527 dated Sep. 29, 2015.
Written Opinion of the International Searching Authority for PCT/JP2015/073527 (PCT/ISA/237) dated Sep. 29, 2015.
Chinese Office Action and Search Report dated Jan. 29, 2019, for Chinese Counterpart Application No. 201580043821.6, with English translation of the Chinese Search Report.

* cited by examiner

FIG. 2

| EVALUATION POINT ID | PART ID | NON-LOAD STATE | | | MAXIMUM LOAD STATE | | |
|---|---|---|---|---|---|---|---|
| | | X-COORDINATE | Y-COORDINATE | Z-COORDINATE | X-COORDINATE | Y-COORDINATE | Z-COORDINATE |
| 00001 | 001 | 0.000 | 0.000 | 0.000 | 0.000 | 0.000 | 0.000 |
| 00002 | 001 | 0.000 | 0.000 | 0.100 | 0.000 | 0.002 | 0.105 |
| 00003 | 001 | 0.000 | 0.100 | 0.100 | 0.000 | 0.101 | 0.108 |
| ... | ... | ... | ... | ... | ... | ... | ... |
| 00233 | 002 | 1.010 | 2.100 | 0.100 | 1.003 | 2.111 | 0.088 |
| 00234 | 002 | 1.010 | 2.100 | 0.200 | 1.015 | 2.108 | 0.187 |
| ... | ... | ... | ... | ... | ... | ... | ... |

| COUNTERMEASURE | RIGIDITY IMPROVEMENT RATE |
|---|---|
| PA | 11.7 TIMES |
| PB | 4.8 TIMES |
| PC | 1.0 TIMES |
| PD | 3.8 TIMES |

STRUCTURE DESIGN SUPPORT DEVICE, STRUCTURE DESIGN SUPPORT METHOD, PROGRAM, AND RECORDING MEDIUM

TECHNICAL FIELD OF THE INVENTION

The present invention relates to a structure design support device, a structure design support method, a program, and a recording medium.

Priority is claimed on Japanese Patent Application No. 2014-168284, filed on Aug. 21, 2014, and Japanese Patent Application No. 2015-131114, filed on Jun. 30, 2015, the contents of which are incorporated herein by reference.

RELATED ART

In the related art, various structure design support devices for performing the evaluation and analysis of a structure at a stage of designing various structures have been proposed. As the structure design support device, in general, a computer is used, and programs for making a computer perform the evaluation and analysis of a structure, or systems with the programs installed therein have been proposed. In such a structure design support device, a model in which the whole of a structure that is a design target, or each part configuring the structure is expressed to be divided into small areas (elements) is constructed, a response to the application of an external force is simulated by using the model, and a design is performed by using the obtained results.

For example, in Patent Documents 1 and 2, a structural analysis technique of analyzing a deformation mode by the application of an external force of each part configuring a structure is described. Specifically, finite element division of discretizing the whole of a structure or each part configuring the structure into a finite area called a finite element (mesh) is performed based on the obtained three-dimensional shape data or the like of the structure. Then, a structural analysis using a finite element method is performed, and the analysis result (a displacement or deformation mode of each part due to the application of an external force) is output. A designer designs the shape of the optimum structure by applying a correction to a structure shape at the initial stage, from the analysis result.

PRIOR ART DOCUMENT

Patent Document

[Patent Document 1] Japanese Patent No. 5440415
[Patent Document 2] Japanese Unexamined Patent Application, First Publication No. 2013-92835

DISCLOSURE OF THE INVENTION

Problems to be Solved by the Invention

When performing a design change on the basis of the result of a structural analysis (applying a correction to a structure shape), it is required to implement an appropriate countermeasure according to the purpose such as strengthening the rigidity of a structure, for example. However, in the techniques described in Patent Documents 1 and 2, only information on the displacement or deformation mode of each part due to the application of an external force can be obtained, and therefore, it is insufficient as information on a design change according to the purpose. In fact, in order to reach the shape of the optimum structure, it is necessary for a designer to detect a portion to be changed, by trial and error based on an experience.

Further, in the analysis methods described in Patent Documents 1 and 2, only information on the displacement or deformation mode of each part due to the application of an external force can be obtained, and therefore, there is a problem in which it is not possible to evaluate the possibility of improvement in performance by, for example, the strengthening of joining to another part. In a structural analysis, originally, an evaluation value of a portion having the high possibility of improvement in performance per mass due to a design change should be high. The strengthening of joining to another part is likely to result in a highly efficient design change such as operating a part which has not functioned so far. That is, in a structural analysis, it is important to use an evaluation value which includes the possibility of improvement in performance by the strengthening of joining to another part. For that purpose, it is necessary to focus attention on a change in relative positional relationship with another part due to the application of an external force.

The present invention has been made in view of such circumstances and has an object to provide a structure design support device, a structure design support method, a program, and a recording medium, in which it is possible to more easily perform a structural analysis, a crash analysis, or the like at a stage of a design of a structure, without recourse to trial and error of a designer. The present invention also has an object to provide a structure design support device, a structure design support method, a program, and a recording medium, in which it is possible to remove noise which is independent of the purpose of a structural analysis, without recourse to trial and error of a designer.

Means for Solving the Problem

According to a first aspect of the present invention, there is provided a structure design support device including: an evaluation point information acquisition unit which acquires evaluation point information representing a position in a first state and a position in a second state, of an evaluation point provided in a structure which is configured of a plurality of parts, and a part to which the evaluation point belongs, among the plurality of parts; and an evaluation value calculation unit which calculates an evaluation value representing the magnitude of a change between the first state and the second state, of a positional relationship between a first evaluation point belonging to a first part and a second evaluation point belonging to a second part different from the first part to which the first evaluation point belongs, by using the evaluation point information acquired in the evaluation point information acquisition unit.

According to a second aspect of the present invention, in the structure design support device according to the first aspect, the evaluation value relating to the first evaluation point may represent the magnitude of a change between the first state and the second state, of a distance between the first evaluation point and the second evaluation point.

According to a third aspect of the present invention, in the structure design support device according to the second aspect, the distance between the first evaluation point and the second evaluation point may be less than or equal to a threshold value set in advance.

According to a fourth aspect of the present invention, in the structure design support device according to the second or third aspect, the second evaluation point may be an evaluation point belonging to a part determined in advance.

According to a fifth aspect of the present invention, in the structure design support device according to any one of the second to fourth aspects, the evaluation value calculation unit may perform specification of a part to which an evaluation point in which the evaluation value is the maximum belongs, among a plurality of parts different from a part to which the evaluation point belongs, and specification of a direction of the part to which an evaluation point in which the evaluation value is the maximum belongs, when being based on a position of the part to which the evaluation point belongs.

According to a sixth aspect of the present invention, in the structure design support device according to the fifth aspect, the evaluation value calculation unit may specify a direction in which the part to which an evaluation point in which the evaluation value is the maximum belongs is displaced when a change from the first state to the second state is made.

According to a seventh aspect of the present invention, in the structure design support device according to any one of the first to sixth aspects, the structure design support device may further include an evaluation result display unit which displays the evaluation value calculated in the evaluation value calculation unit, and the evaluation result display unit may adopt a configuration of displaying a name of the part to which the evaluation point corresponding to the evaluation value belongs.

According to an eighth aspect of the present invention, in the structure design support device according to any one of the first to seventh aspects, the structure design support device may repeatedly carry out a process of calculating the evaluation value.

According to a ninth aspect of the present invention, there is provided a structure design support method including: a first process of acquiring evaluation point information representing a position in a first state and a position in a second state, of an evaluation point provided in a structure which is configured of a plurality of parts, and a part to which the evaluation point belongs, among the plurality of parts; and a second process of calculating an evaluation value representing the magnitude of a change between the first state and the second state, of a positional relationship between a first evaluation point belonging to a first part and a second evaluation point belonging to a second part different from the first part to which the first evaluation point belongs, by using the evaluation point information acquired in the first process.

According to a tenth aspect of the present invention, in the structure design support method according to the ninth aspect, the evaluation value relating to the first evaluation point may represent the magnitude of a change between the first state and the second state, of a distance between the first evaluation point and the second evaluation point.

According to an eleventh aspect of the present invention, in the structure design support method according to the tenth aspect, the distance between the first evaluation point and the second evaluation point may be less than or equal to a threshold value set in advance.

According to a twelfth aspect of the present invention, in the structure design support method according to the tenth or eleventh aspect, the second evaluation point may be an evaluation point belonging to a part determined in advance.

According to a thirteenth aspect of the present invention, in the structure design support method according to any one of the tenth to twelfth aspects, in the second process, specification of a part to which an evaluation point in which the evaluation value is the maximum belongs, among a plurality of parts different from a part to which the evaluation point belongs, and specification of a direction of the part to which an evaluation point in which the evaluation value is the maximum belongs, when being based on a position of the part to which the evaluation point belongs may be performed.

According to a fourteenth aspect of the present invention, in the structure design support method according to the thirteenth aspect, in the second process, a direction in which the part to which an evaluation point in which the evaluation value is the maximum belongs is displaced when a change from the first state to the second state is made may be specified.

According to a fifteenth aspect of the present invention, in the structure design support method according to any one of the ninth to fourteenth aspects, the structure design support method may further include: a third process of displaying the calculated evaluation value and displaying a name of the part to which the evaluation point corresponding to the evaluation value belongs.

According to a sixteenth aspect of the present invention, in the structure design support method according to any one of the ninth to fifteenth aspects, a process of calculating the evaluation value may be repeatedly carried out by the second process.

According to a seventeenth aspect of the present invention, there is provided a program causing a computer to function as: an evaluation point information acquisition unit which acquires evaluation point information representing a position in a first state and a position in a second state, of an evaluation point provided in a structure which is configured of a plurality of parts, and a part to which the evaluation point belongs, among the plurality of parts; and an evaluation value calculation unit which calculates an evaluation value representing the magnitude of a change between the first state and the second state, of a positional relationship between a first evaluation point belonging to a first part and a second evaluation point belonging to a second part different from the first part to which the first evaluation point belongs, by using the evaluation point information acquired in the evaluation point information acquisition unit.

According to an eighteenth aspect of the present invention, in the program according to the seventeenth aspect, the evaluation value relating to the first evaluation point may represent the magnitude of a change between the first state and the second state, of a distance between the first evaluation point and the second evaluation point.

According to a nineteenth aspect of the present invention, in the program according to the eighteenth aspect, the distance between the first evaluation point and the second evaluation point may be less than or equal to a threshold value set in advance.

According to a twentieth aspect of the present invention, in the program according to the eighteenth or nineteenth aspect, the second evaluation point may be an evaluation point belonging to a part determined in advance.

According to a twenty-first aspect of the present invention, in the program according to any one of the eighteenth to the twentieth aspects, the evaluation value calculation unit may perform specification of a part to which an evaluation point in which the evaluation value is the maximum belongs, among a plurality of parts different from a part to which the evaluation point belongs, and specification of a direction of the part to which an evaluation point in which the evaluation value is the maximum belongs, when being based on a position of the part to which the evaluation point belongs.

According to a twenty-second aspect of the present invention, in the program according to the twenty-first aspect, the evaluation value calculation unit may specify a direction in which the part to which an evaluation point in which the evaluation value is the maximum belongs is displaced when a change from the first state to the second state is made.

According to a twenty-third aspect of the present invention, in the program according to any one of the seventeenth to twenty-second aspects, the program may further cause the computer to function as: an evaluation result display unit which displays the calculated evaluation value and displays a name of the part.

According to a twenty-fourth aspect of the present invention, in the program according to any one of the seventeenth to twenty-third aspects, the computer may be made to repeatedly carry out a process of calculating the evaluation value.

According to a twenty-fifth aspect of the present invention, there is provided a computer-readable recording medium having the program according to any one of the seventeenth to twenty-fourth aspects recorded therein.

Effects of the Invention

According to the respective aspects of the present invention, it is possible to more easily perform a structural analysis or a crash analysis at a stage of a design of a structure, without recourse to trial and error of a designer. For example, it is possible to more easily detect a portion to be changed according to a desired purpose such as increasing the rigidity of a structure, at a stage of a design of the structure.

Further, according to the respective aspects of the present invention, it is possible to remove noise which is independent of the purpose of an analysis, in a structural analysis at a stage of a design of a structure, without recourse to trial and error of a designer.

BRIEF DESCRIPTION OF THE DRAWINGS

FIG. 2 is a table showing an example of evaluation point information in the same embodiment.

EMBODIMENTS OF THE INVENTION

Hereinafter, an embodiment of the present invention will be described with reference to the drawings. In the following embodiment, as an example of the purpose of a structural analysis in a stage of a design of a structure, the purpose of improving the rigidity of a structure will be described. However, as the purpose of a structural analysis in a stage of a design of a structure, it is not limited to improvement in the rigidity of a structure, and it is possible to reduce the rigidity of a structure for a reduction in weight or to perform an analysis of a structure tailored to the needs, such as a crash analysis of a structure.

Figure 1:
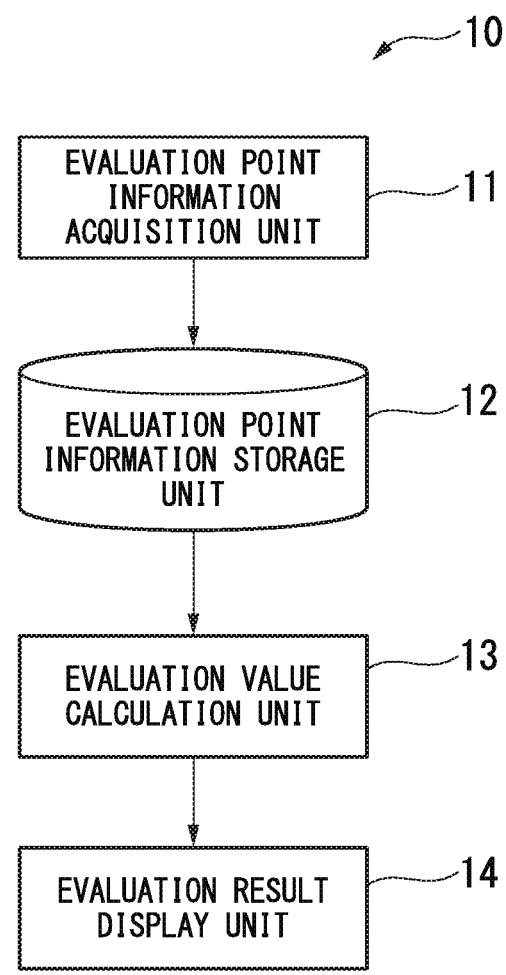
FIG. 1 is a schematic block diagram showing the configuration of a structure design support device 10 according to an embodiment of the present invention.

FIG. 1 is a schematic block diagram showing the configuration of a structure design support device 10 according to an embodiment of the present invention. The structure design support device 10 evaluates the rigidity of a structure composed of a plurality of parts. This structure is made as an assembly of a plurality of parts joined together by, for example, welding, caulking, a bolt, or the like. The structure design support device 10 includes an evaluation point information acquisition unit 11, an evaluation point information storage unit 12, an evaluation value calculation unit 13, and an evaluation result display unit 14.

The evaluation point information acquisition unit 11 acquires evaluation point information representing the position in a first state and the position in a second state, of an evaluation point provided in a structure which is an evaluation target, and a part to which the evaluation point belongs, among the parts configuring the structure. For example, the first state is a state where a load is not applied to the structure, and the second state is a state where the assumed maximum load is applied to the structure. Further, for example, the evaluation point is an apex (a node) of an element in a finite element method when the deformation of the structures in each state is analyzed by the finite element method, and the evaluation point information is calculated by analyzing the structure by the finite element method. The evaluation point information is not limited thereto and may be calculated by, for example, numerical simulation other than the finite element method or may be obtained by capturing an image of the structure in each state and detecting the position of an observation point marked on the surface of the structure, from the captured image.

The evaluation point information storage unit 12 stores the evaluation point information acquired in the evaluation point information acquisition unit 11. The evaluation value calculation unit 13 calculates an evaluation value of each evaluation point by using the evaluation point information stored in the evaluation point information storage unit 12. Here, the evaluation value of the evaluation point is a value representing the magnitude of a change between the first state and the second state, of the positional relationship between a part to which the evaluation point belongs, and a part different from the part to which the evaluation point belongs. Details of a method of calculating the evaluation value by the evaluation value calculation unit 13 will be described later.

The evaluation result display unit 14 creates and displays a three-dimensional image of the structure, in which the evaluation value calculated in the evaluation value calculation unit 13 is represented by shading. The evaluation value may be represented in color, rather than shading. Further, the evaluation result display unit 14 may output image data or an image signal representing the created three-dimensional image or may output the evaluation value.

FIG. 2 is a table showing an example of the evaluation point information. In the example shown in FIG. 2, the first state is a non-load state where a load is not applied to the structure, and the second state is a maximum load state where the assumed maximum load is applied to the structure. In the example shown in FIG. 2, the evaluation point information includes, with respect to each evaluation point, an evaluation point ID of the evaluation point, a part ID of the part to which the evaluation point belongs, an X-coordinate, a Y-coordinate, and a Z-coordinate in the non-load state, and an X-coordinate, a Y-coordinate, and a Z-coordinate in the maximum load state.

In FIG. 2, the evaluation point information about the first evaluation point includes the evaluation point ID "0001", the part ID "001", the X-coordinate "0.000", the Y-coordinate "0.000", and the Z-coordinate "0.000" in the non-load state, and the X-coordinate "0.000", the Y-coordinate "0.000", and the Z-coordinate "0.000" in the maximum load state. Similarly, the evaluation point information about the second evaluation point includes the evaluation point ID "0002", the part ID "001", the X-coordinate "0.000", the Y-coordinate "0.000", and the Z-coordinate "0.100" in the non-load state, and the X-coordinate "0.000", the Y-coordinate "0.002", and the Z-coordinate "0.105" in the maximum load state.

Figure 3:
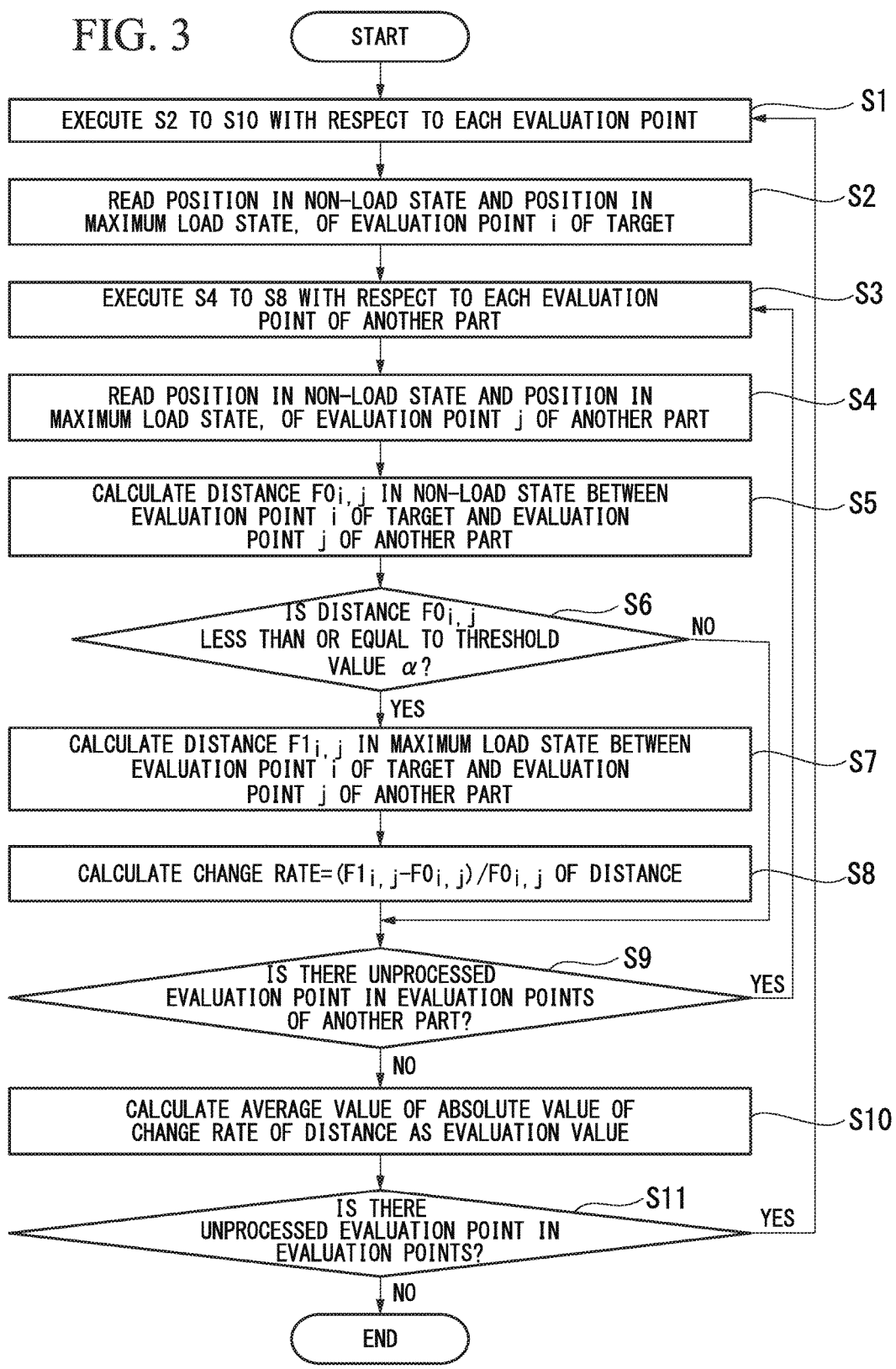
FIG. 3 is a flowchart describing an operation of an evaluation value calculation unit 13 in the same embodiment.

FIG. 3 is a flowchart describing an operation of the evaluation value calculation unit 13. In FIG. 3, a case where the first state is the non-load state where a load is not applied to the structure, and the second state is the maximum load state where the assumed maximum load is applied to the structure is described as an example. The evaluation value calculation unit 13 executes processing from Step S2 to Step S10 with respect to each evaluation point which is included in the evaluation point information stored in the evaluation point information storage unit 12 (Steps S1 to S11). In Step S2, the evaluation value calculation unit 13 reads the position (the X-coordinate, the Y-coordinate, and the Z-coordinate) in the non-load state and the position (the X-coordinate, the Y-coordinate, and the Z-coordinate) in the maximum load state, of an evaluation point i of a target from the evaluation point information storage unit 12. Next, the evaluation value calculation unit 13 executes processing from Step S4 to Step S8 with respect to each evaluation point of another part (a part except for the part to which the evaluation point of the target belongs) (Steps S3 to S9).

In Step S4, the evaluation value calculation unit 13 reads the position in the non-load state and the position in the maximum load state, of an evaluation point j of another part from the evaluation point information storage unit 12. Next, the evaluation value calculation unit 13 calculates a distance $F0_{i,j}$ in the non-load state between the evaluation point i of the target and the evaluation point j of another part by using the positions read in Steps S2 and S4 (Step S5). For example, when the X-coordinate, the Y-coordinate, and the Z-coordinate of the evaluation point i of the target in the non-load state respectively are $X_i$, $Y_i$, and $Z_i$, and the X-coordinate, the Y-coordinate, and the Z-coordinate of the evaluation point j of another part in the non-load state respectively are $X_j$, $Y_j$, and $Z_j$, the distance $F0_{i,j}$ is calculated by the following Expression (1).

[Expression 1]

$$F0_{i,j}=\sqrt{(X_i-X_j)^2+(Y_i-Y_j)^2+(Z_i-Z_j)^2} \quad (1)$$

The evaluation value calculation unit 13 determines whether or not the distance $F0_{i,j}$ calculated in Step S5 is less than or equal to a threshold value α set in advance (Step S6). When a determination that the distance $F0_{i,j}$ is not less than or equal to the threshold value α is made (Step S6—No), the processing proceeds to Step S9. That is, if there is an unprocessed evaluation point in the evaluation points of another part, the evaluation value calculation unit 13 returns back to Step S3 and executes processing with respect to an evaluation point of the subsequent other part. If there is no unprocessed evaluation point in the evaluation points of another part, the loop from Step S3 to Step S9 is ended and the processing of Step S10 is executed.

On the other hand, when a determination that the distance $F0_{i,j}$ is less than or equal to the threshold value α is made in Step S6 (Step S6—Yes), the evaluation value calculation unit 13 calculates a distance $F1_{i,j}$ in the maximum load state between the evaluation point i of the target and the evaluation point j of another part by using the positions read in Steps S2 and S4 (Step S7). The evaluation value calculation unit 13 calculates a change rate $dF_{i,j}=(F1_{i,j}-F0_{i,j})/F0_{i,j}$ from the distance $F0_{i,j}$ to the distance $F1_{i,j}$ (Step S8). Next, the processing proceeds to Step S9. That is, if there is an unprocessed evaluation point in the evaluation points of another part, the evaluation value calculation unit 13 returns back to Step S4 and executes processing with respect to an evaluation point of the subsequent other part. If there is no unprocessed evaluation point in the evaluation points of another part, the loop from Step S3 to Step S9 is ended and the processing of Step S10 is executed.

In Step S10, the evaluation value calculation unit 13 calculates the average value with respect to the evaluation point j of another part, of the absolute value of the change rate $dF_{i,j}$ of the distance calculated with respect to the evaluation point of the target, as an evaluation value $E_i$. In other words, the evaluation value $E_i$ is calculated by the following Expression (2).

[Expression 2]

$$E_i = \frac{1}{n}\sum_{j=1}^{n}\left|\frac{F1_{i,j} - F0_{i,j}}{F0_{i,j}}\right| \quad (2)$$

However, j is j satisfying the relationship of $F0_{i,j} \leq \alpha$, and n is the number of j satisfying the relationship of $F0_{i,j} \leq \alpha$. That is, n is a value which is determined based on the threshold value $\alpha$.

Further, it is possible to eliminate components of rigid translation and rotational motion from positional information between the respective parts by using the evaluation value E, shown in Expression (2), and therefore, it becomes possible to remove noise which is independent of the purpose of an analysis.

Next, the processing proceeds to Step S11. That is, if there is an unprocessed evaluation point in the evaluation points, the evaluation value calculation unit 13 returns back to Step S1 and executes processing with respect to the subsequent evaluation point. If there is no unprocessed evaluation point in the evaluation points, the loop from Step S1 to Step S11, that is, the processing is ended.

Figure 4:
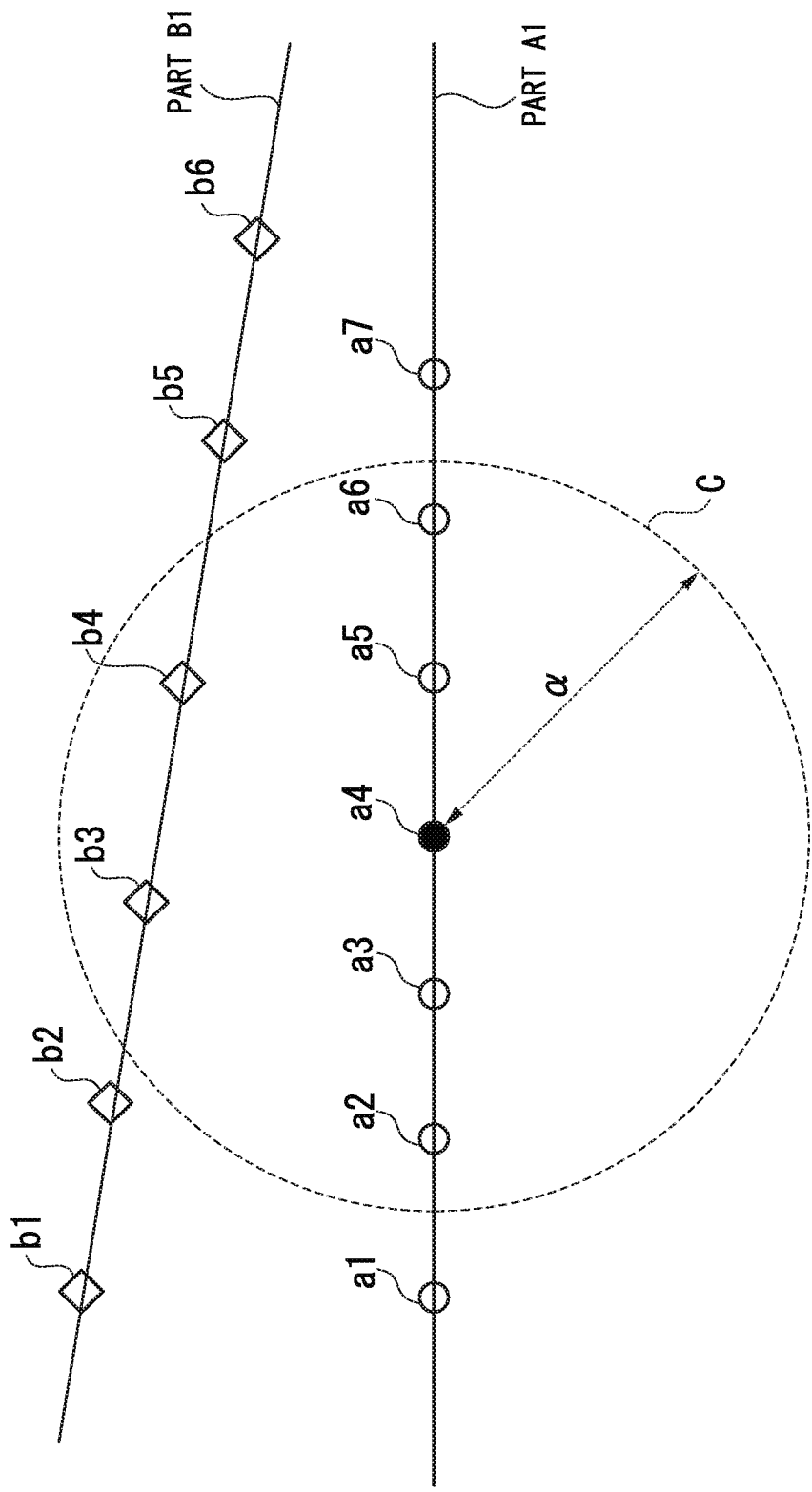
FIG. 4 is a diagram describing the condition that "j is j satisfying the relationship of $F0_{i,j} \leq \alpha$" in Expression (2) in the same embodiment.

FIG. 4 is a diagram describing the condition that "j is j satisfying the relationship of $F0i,j \leq \alpha$" in Step S6 of FIG. 3, that is, Expression (2). FIG. 4 is a cross section which includes a part A1 and a part B1 which configure a structure. Evaluation points a1 to a7 are provided in the part A1, and evaluation points b1 to b6 are provided in the part B1. FIG. 4 is a diagram describing when calculating an evaluation value of the evaluation point a4 that is an evaluation target. A circle C shown by a dashed line is a cross section of a sphere having a radius $\alpha$ and centered on the evaluation point a4. The sphere (the circle C) having the radius $\alpha$ corresponds to an evaluation area, and a point which is located on the inside of the sphere (the circle C) having the radius $\alpha$ is an evaluation point which is used when calculating the evaluation value $E_i$. At this time, the evaluation value calculation unit 13 calculates the evaluation value $E_i$ by calculating the right-hand side (that is, the average value of the absolute value of the value obtained by dividing the difference between the distance $F1_{i,j}$ and the distance $F0_{i,j}$ by the distance $F0_{i,j}$) of Expression (2) with respect to the evaluation points b3 and b4 in which the distance $F0_{i,j}$ is less than or equal to $\alpha$, among the evaluation points (in FIG. 4, the evaluation points b1 to b6) belonging to a part (in FIG. 4, the part B1) except for the part to which the evaluation point a4 belongs.

The value of the threshold value $\alpha$ is set to be a variable according to a target part, the mesh of the finite element method, a phase of a design, and the like. The threshold value $\alpha$ may be set in advance or may be set by an operator who operates the structure design support device 10. It is desirable that the value of the threshold value $\alpha$ is a value according to a magnitude in which a change in structure is possible. The evaluation value calculation unit 13 may be configured so as to store the threshold value $\alpha$ according to a magnitude in which a change in structure is possible, in advance, and determine, if an operator specifies a magnitude in which a change in structure is possible, the threshold value $\alpha$ according to the magnitude specified by the operator, according to the storing. In examples described below, the threshold value (the radius of the sphere of the evaluation area) $\alpha$ is set to be 100 mm.

Further, it is desirable that the evaluation area is set to be a range in which a change in structure is possible. For this reason, a geometric range of a sphere, a hexahedron, or the like may be specified, and a configuration may be made in which only plural parts are selected and only the area between the parts is set as the evaluation area. Further, a combination of the above is also acceptable. However, it is desirable that in order to secure the number of analysis points falling into the evaluation area, the evaluation area is larger than a sphere having a diameter of approximately four or more times the distance between the analysis points. Further, the magnitude of a change in structure that can be taken is different according to the stage of a design, and therefore, it is conceivable that the evaluation area can be utilized in various design stages by fitting the size of the evaluation area to it.

Further, the evaluation value $E_i$ has been described as being calculated by Expression (2). However, there is no limitation thereto. For example, as the distance, a specific axial distance may be used. Further, the evaluation value $E_i$ may be calculated by, for example, the following Expression (3) or (4).

[Expression 3]

$$E_i = \frac{1}{n}\sum_{j=1}^{n}\left|\frac{F1_{i,j} - F0_{i,j}}{F0_{i,j}}\right|^m \quad (3)$$

[Expression 4]

$$E_i = \frac{1}{n}\sum_{j=1}^{n}\left|\frac{F1_{i,j} - F0_{i,j}}{F0_{i,j}} \times f(F0_{i,j}, F1_{i,j} - F0_{i,j})\right| \quad (4)$$

In Expression (3), the evaluation value between the respective points is exponentiated (by m-th power). In this way, it can be expected that it is possible to take a value in which a weak portion is more emphasized. In Expression (4), the evaluation value between the respective points is multiplied by a correction coefficient using a distance before deformation or a change in distance. In this way, it can be expected that a weak portion in structure can be more accurately searched.

Further, when calculating the evaluation value $E_i$, the condition that "j is j satisfying the relationship of $F0_{i,j} \leq \alpha$" is set. However, instead of this, the condition that the "evaluation point j is the evaluation point j belonging to a part determined in advance" may be used. Further, the condition of satisfying both of the condition that "j is j satisfying the relationship of $F0_{i,j} \leq \alpha$" and the condition that the "evaluation point j is the evaluation point j belonging to a part determined in advance" may be used, and the condition of satisfying either of both the conditions may be used. Further, in these conditions, the part determined in advanced may be one, may be a plurality, may be determined in advance for each evaluation point i of the target, or may be determined in advance for each part to which the evaluation point i of the target belongs.

In the following examples, all the evaluation points j satisfying the conditions are calculated. However, calculation may be performed with the number of evaluation points j limited. For example, it is conceivable to limit the number of evaluation points j according to the fineness of the mesh of the finite element method in the vicinity of the evaluation point. Further, the size or the shape of the evaluation area may be changed according to the fineness of the mesh of the finite element method in the vicinity of the evaluation point.

In this manner, the structure design support device 10 calculates an evaluation value representing the magnitude of a change between the first state and the second state, of the positional relationship of an evaluation point between a part to which the evaluation point belongs and a part different from the part to which the evaluation point belongs.

In this way, a part in which a positional relationship with a peripheral part is changed when the state is changed is detected. The part in which a positional relationship with a peripheral part is changed when the state is changed has weak joining to the peripheral part, and it is presumed that the rigidity of a structure is reduced due to the weak joining. For this reason, by strengthening the joining, it can be expected that the rigidity of the structure is increased. Further, the strengthening of joining can be performed by increasing the number of spot welds or additionally joining a small steel sheet and therefore, in many cases, weight that increases more than in the strengthening of a part such as increasing a sheet thickness is less. Accordingly, it is possible to more easily detect a portion suitable for increasing the rigidity while suppressing an increase in the weight of a structure.

Further, in this embodiment, the following processing may be further executed.

When obtaining the evaluation value $E_i$, with respect to the evaluation point i of the target and the evaluation point j of another part, the change rate $dF_{i,j}$ (j=1 to n) from the first state to the second state is integrated. However, an evaluation point m in which $dF_{i,j}$ is the maximum, among the plurality of evaluation points j (j=1 to n), is extracted. Then, the direction of the evaluation point m in a case where the evaluation point i in the first state is set to be the starting point is specified, and a vector composed of the direction and the magnitude of a change rate $dF_{i,m}$ is set as an evaluation value. All of these evaluations are performed in the evaluation value calculation unit of FIG. 1. In the flowchart of FIG. 3, the evaluations are performed at the same time as the calculation of the evaluation value $E_i$ in Step S10. The vector obtained as the evaluation value becomes an index indicating a direction in which a part that reduces the rigidity of a structure exists with respect to the part which includes the evaluation point i. The result is displayed on the evaluation display unit 14.

That is, the evaluation display unit 14 has a function to display the vector which is the evaluation value. Further, the evaluation display unit 14 may have a function to display the name of a member that is a target, or the like.

In this way, the part in which a positional relationship with the peripheral part is changed when the state is changed is more accurately specified. The part in which a positional relationship with the peripheral part is changed when the state is changed has weak joining to the peripheral part, and there is a possibility that the rigidity of a structure may be reduced due to the weak joining. For this reason, by strengthening the joining, it can be expected that the rigidity of the structure is further increased. Further, the strengthening of joining can be performed by increasing the number of spot welds or additionally joining a small member, and therefore, in many cases, weight that increases more than in the strengthening of a part such as increasing a sheet thickness is less. Accordingly, it is possible to easily detect a portion suitable for further increasing the rigidity while suppressing an increase in the weight of a structure.

Further, in this embodiment, the evaluation point m in which $dF_{i,j}$ is the maximum, among the plurality of evaluation points j (j=1 to n), is extracted, and thereafter, the direction of the evaluation point m in a case where the evaluation point i in the first state is set to be the starting point, and the direction of the evaluation point m in a case where the evaluation point i in the second state is set to be the starting point are specified. Further, the difference between the direction of the evaluation point m with respect to the evaluation point i in the first state and the direction of the evaluation point m with respect to the evaluation point i in the second state is determined. The direction which is determined from the difference becomes a displacement direction of a part which includes the evaluation point m with respect to a part which includes the evaluation point i, when a change from the first state to the second state is made. The result is displayed on the evaluation display unit 14.

By specifying the displacement direction, it is possible to determine an optimum method when the part which includes the evaluation point i and the part which includes the evaluation point m are joined together by using a stiffener. In a case of stiffening two parts by using a stiffener, it is necessary to join the stiffener and each part together. At this time, it is favorable if the joining form of the stiffener is selected such that a longitudinal direction of the joint surface between each part and the stiffener is parallel to the displacement direction of the part which includes the evaluation point m with respect to the part which includes the evaluation point i when a change from the first state to the second state is made. The result may be displayed on the evaluation display unit 14 together.

Figure 20A:
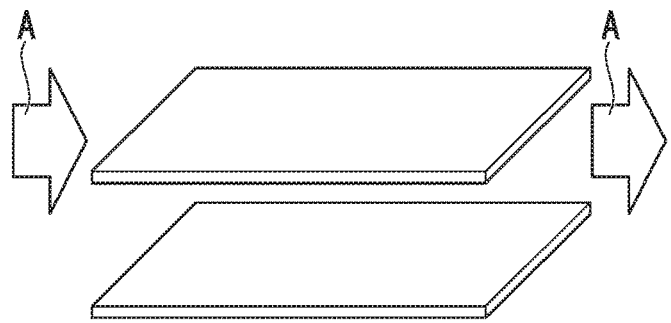
FIG. 20A is a schematic diagram showing an example in which two parts are stiffened by a stiffener.
Figure 20B:
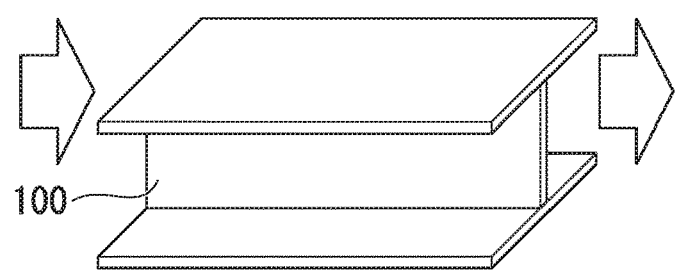
FIG. 20B is a schematic diagram showing an example in which two parts are stiffened by a stiffener.
Figure 20C:
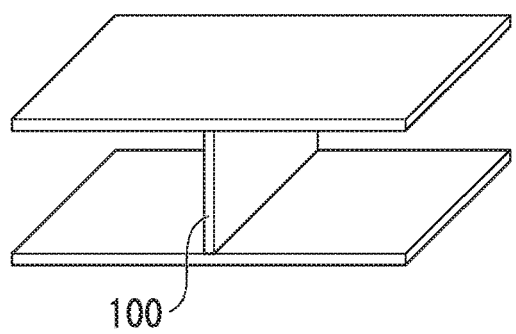
FIG. 20C is a schematic diagram showing an example in which two parts are stiffened by a stiffener.

Specifically, as shown in FIG. 20A, in a case where there is a pair of plate-shaped parts disposed parallel to each other and a change from the first state to the second state is made, it is assumed that the displacement direction of the upper part is the direction indicated by an arrow A in the drawing. In this case, in order to stiffen these two parts with a plate-shaped stiffener, for example, a method of performing joining such that the longitudinal direction of the joint portion between a stiffener 100 and each part is parallel to the displacement direction A, as shown in FIG. 20B, and a method of performing joining such that the longitudinal direction of the joint portion between the stiffener 100 and each part is orthogonal to the displacement direction A, as shown in FIG. 20C, are conceivable. Both of FIG. 20B and FIG. 20C illustrate a case where end portions in the width direction of the stiffener and the plate-shaped parts are butt-welded. In this case, in terms of an increase in the rigidity of a structure which includes the two parts, it is effective to perform joining such that the longitudinal direction of the joint portion (the welded portion) between the stiffener 100 and each part is parallel to the displacement direction A, as shown in FIG. 20B.

Further, a better structure can be designed by repeatedly carrying out a process of determining a place on which a countermeasure is to be implemented, by carrying out this evaluation method, and implementing a countermeasure thereon. By repeatedly carrying out the process, a place to which a load is not transmitted at the early stage also starts working, and a hidden place on which a countermeasure is to be implemented can be found.

Further, it is possible to perform an evaluation by adding or changing a member on the basis of the evaluation at a certain stage and comparing a structure before the member is added or changed, with a structure after the member is added or changed. For example, it is possible to compare the optimum binder, the optimum sheet thickness, whether there is no adverse effect on other parts, or the like, before and after. By repeatedly carrying out the comparison process, it is possible to design a better structure.

Figure 23:
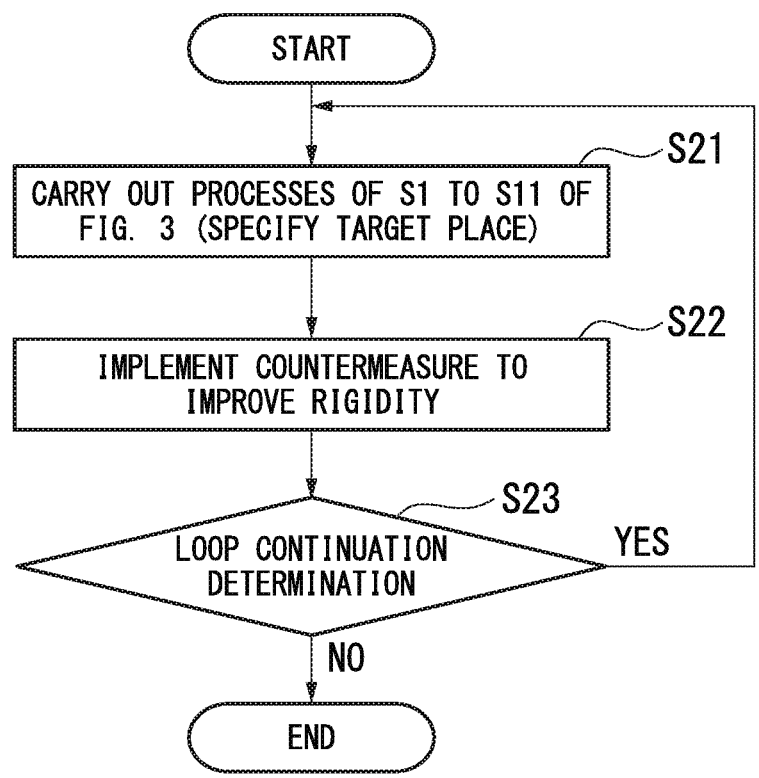
FIG. 23 is a flowchart showing a flow of a repeated evaluation in the same embodiment.

FIG. 23 is a flowchart showing a flow of a repeated evaluation in this example. First, in Step S21, the processes of Steps S1 to S11 of FIG. 3 is carried out. In this way, a place for a countermeasure at this point in time is specified.

Next, in Step S22, a countermeasure to improve rigidity is implemented. As the countermeasure to improve rigidity, a change of a sheet thickness, strengthening of joining to another part, or the like is conceivable. Preferably, the strengthening of joining to another part is carried out. More preferably, it is favorable to carry out it by the method of the following Example 3 or 4.

Next, in Step S23, a loop continuation determination is carried out. It is favorable that the loop continuation determination is performed based on the "amount of improvement of a rigidity value or the amount of increase of mass" due to a countermeasure. When the "amount of improvement of a rigidity value or the amount of increase of mass" becomes less than or equal to a certain threshold value, it is determined to exit the loop (end the repeated evaluation). Further, when the rigidity value becomes greater than or equal to the threshold value, or when the amount of improvement of the rigidity value due to the countermeasure becomes less than or equal to the threshold value, it may be determined to exit the loop (end the repeated evaluation). In a case where it is not determined to exit the loop, the processing returns back to Step S21 and a place for a countermeasure is specified again.

Each step of this example described above may be configured such that the structure design support device 10 automatically performs it.

EXAMPLE 1

Figure 5:
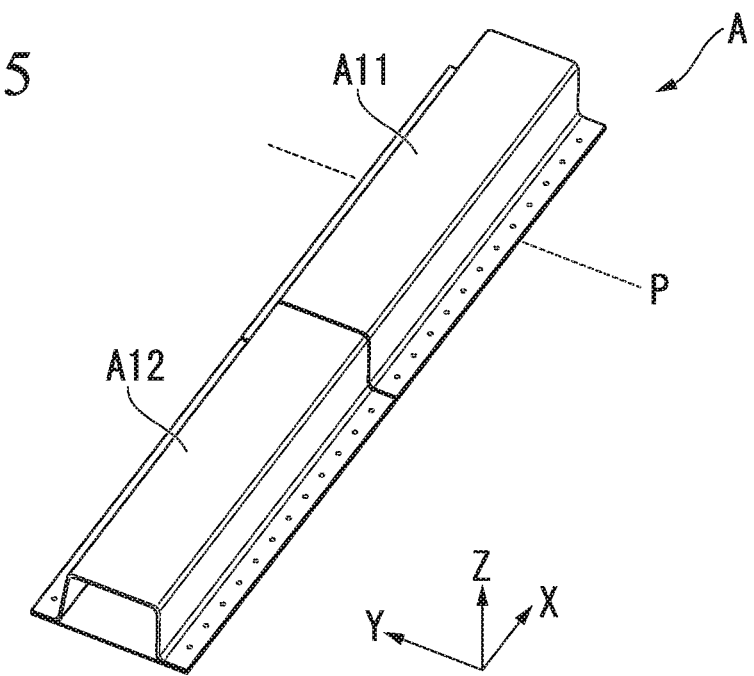
FIG. 5 is an external view (Part 1) of a structure A in Example 1.
Figure 6:
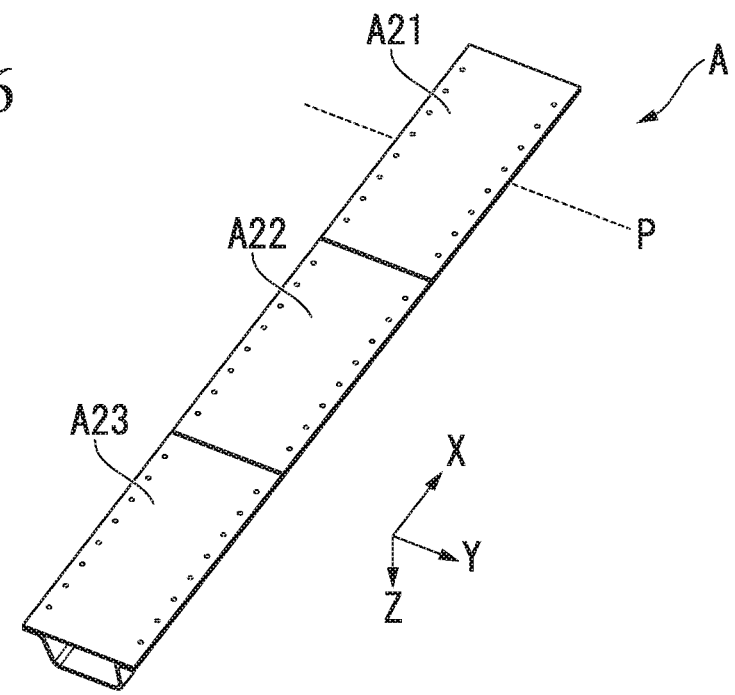
FIG. 6 is an external view (Part 2) of the structure A in the same example.
Figure 7:
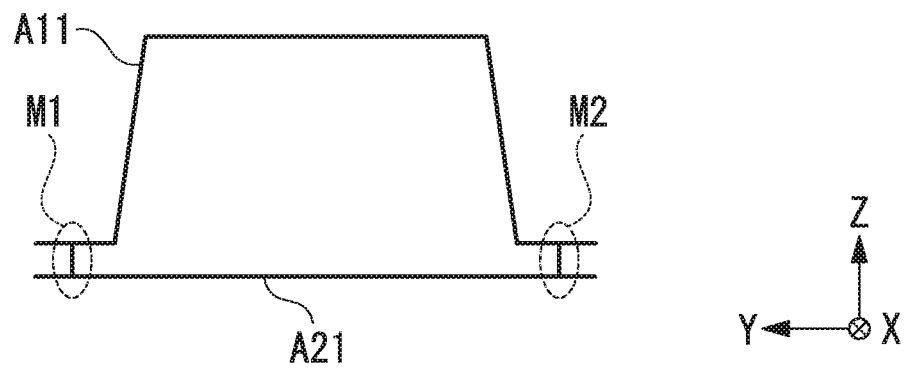
FIG. 7 is a cross-sectional view of the structure A in the same example.

In Example 1, an example in which a structure A shown in FIGS. 5 to 7 is analyzed by the structure design support device 10 is shown. FIGS. 5 and 6 are external views of the structure A, and FIG. 7 is a cross-sectional view in a cross section P of the structure A. The structure A is a structure in which steel sheets A11 and A12 having a sheet thickness of 1 mm and the same shape and pressed so as to have a hat shape in a cross section are arranged in a longitudinal direction (an X-axis direction) and steel sheets A 21, 22, and 23 each having the same width as each of the steel sheets A11 and A12 and a length of ⅔ of the length of each of the steel sheets A11 and A12 are spot-welded (M1, M2, and the like in FIG. 7) to the steel sheets A11 and A12 as back plates at edge portions of the steel plates A11 and A12.

Figure 8:
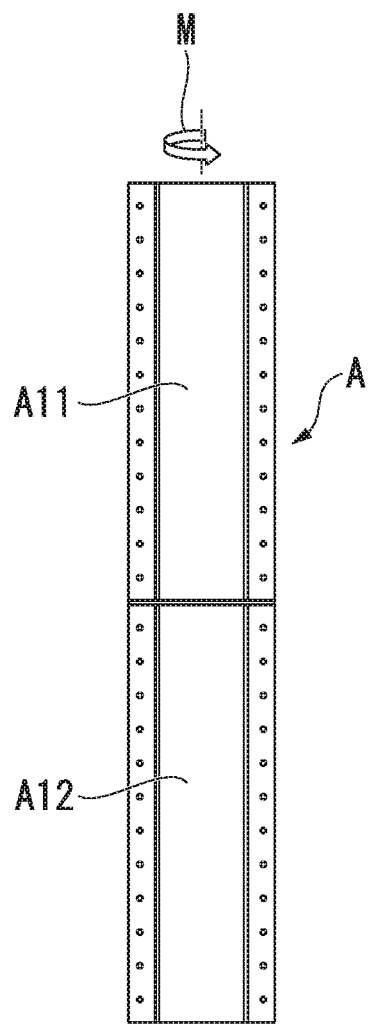
FIG. 8 is a diagram describing a second state in the same example.

In this example, the first state is a non-load state where no load is applied to the structure A, and the second state is a state where a torsional moment about the axis in the longitudinal direction of the structure A is applied. FIG. 8 is a diagram describing the second state. As shown in FIG. 8, in the second state, a torsional moment of 1000 Nmm is applied to one end on the steel sheet A11 side and one end on the steel sheet A12 side is fixed.

Figure 9:
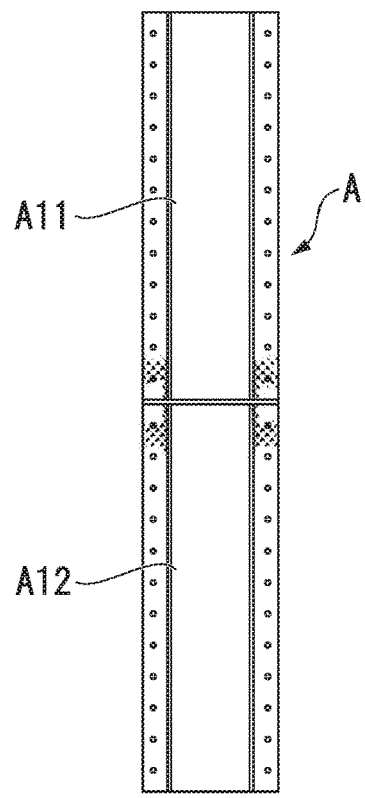
FIG. 9 is a diagram (Part 1) in which strain energy density when being in the second state is plotted by shading, as a comparative example with respect to the same example.
Figure 10:
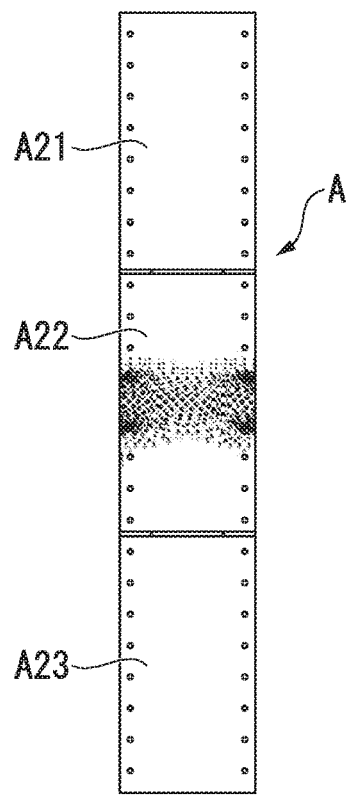
FIG. 10 is a diagram (Part 2) in which strain energy density when being in the second state is plotted by shading, as a comparative example with respect to the same example.

FIGS. 9 and 10 are diagrams in which strain energy density when being in the second state is plotted by shading, as comparative examples. The greater the strain energy density, the thicker the shading becomes. It can be seen that the strain energy density is concentrated in a place close to the break between the steel sheet A11 and the steel sheet A12, among the spot welds of the steel sheet A22 to the steel sheet A11 or the steel sheet A12.

Figure 11:
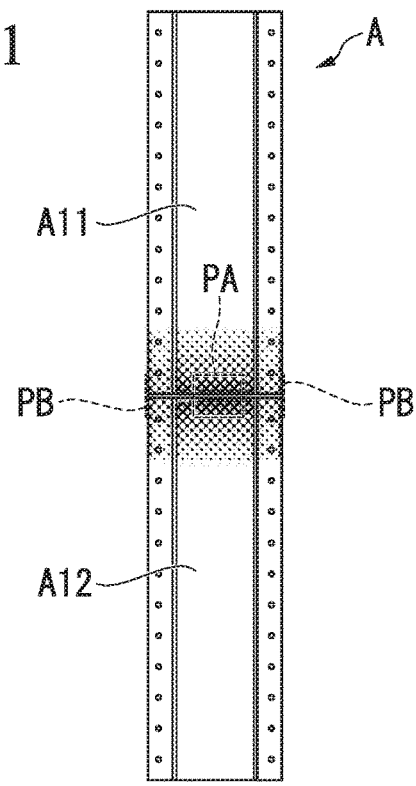
FIG. 11 is a diagram (Part 1) showing a display example by the structure design support device 10 in the same example.
Figure 12:
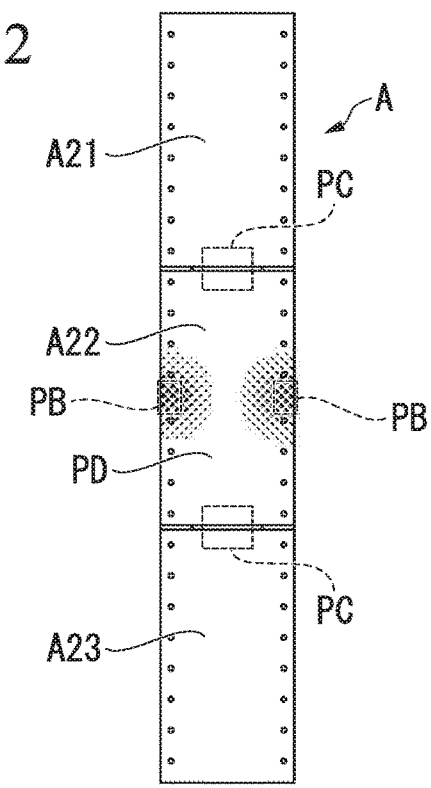
FIG. 12 is a diagram (Part 2) showing a display example by the structure design support device 10 in the same example.

On the other hand, FIGS. 11 and 12 are diagrams showing display examples by the structure design support device 10. The display examples of FIGS. 11 and 12 are display examples when the structure design support device 10 performs and displays an analysis with respect to the structure A when the first state is the non-load state and the second state is the load state shown in FIG. 8. As shown in FIGS. 11 and 12, the evaluation value $E_i$ of a portion in which the steel sheets A11 and A12 are in contact with each other has a large value.

Figures 13, 14:
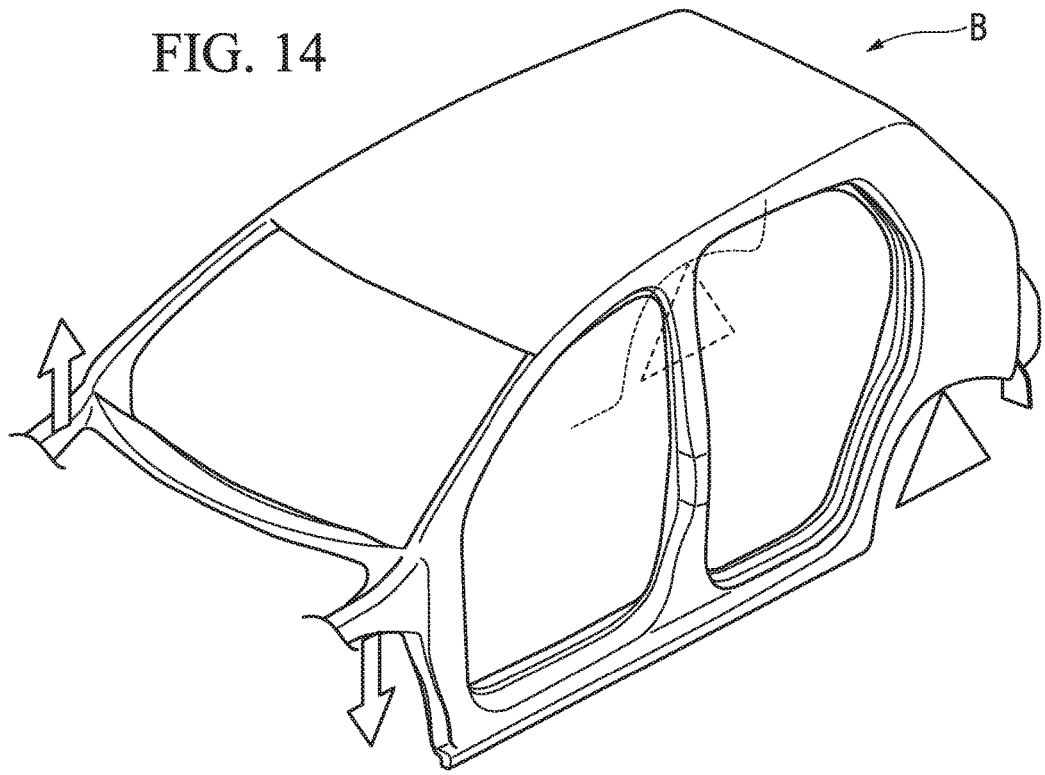
FIG. 13 is a table showing a rigidity improvement rate when a countermeasure has been implemented on each of portions PA, PB, PC, and PD in the same example.
FIG. 14 is a diagram describing the second state in Example 2.

FIG. 13 is a table showing a rigidity improvement rate when the following countermeasure has been implemented on each of portions PA, PB, PC, and PD in FIGS. 11 and 12. In the case of the portion PA, a countermeasure to add a steel sheet joining the steel sheet A11 and the steel sheet A12 together is implemented on the upper surface of the hat form. In the case of the portion PB, a countermeasure to add four spot welding places is implemented. In the case of the portion PC, a countermeasure to add a steel sheet joining the steel sheet A21 and the steel sheet A22 together and a steel sheet joining the steel sheet A22 and the steel sheet A23 together is implemented. Further, in the case of the portion PD, a countermeasure to double the sheet thickness of the steel sheet A22 is implemented.

The countermeasures with respect to the portions PA and PB are countermeasures to strengthen the joining of portions in which the evaluation value $E_i$ by the structure design support device 10 has a large value, in FIGS. 11 and 12. On the other hand, the countermeasure with respect to the portion PC is a comparative example of the countermeasure with respect to the portion PA and is a countermeasure to strengthen the joining of portions in which the portions are similar to the portion PA as structure, however, the evaluation value $E_i$ is not particularly a large value. Further, the countermeasure with respect to the portion PC is a conventional countermeasure technique, and a countermeasure is implemented on a portion in which the strain energy density shown in FIGS. 9 and 10 is particularly large.

As shown in FIG. 13, in the countermeasures with respect to the portions PA and PB, the rigidity improvement rates respectively are 11.7 times and 4.8 times, and it can be seen that the rigidity is greatly improved. On the other hand, in the countermeasure with respect to the portion PC as a comparative example, the rigidity improvement rate is 1.0 times, and it can be seen that the effect is not obtained. Further, in the countermeasure with respect to the portion PD which is a conventional countermeasure technique, the rigidity improvement rate is 3.8 times, and although the rigidity is improved, the effect to the degree of those of the countermeasures with respect to the portions PA and PB is not obtained.

In this manner, by strengthening the joining to the peripheral part, of the portion in which the evaluation value $E_i$ by the structure design support device 10 has a large value, it is possible to efficiently improve the rigidity. Further, in the countermeasure with respect to the portion PA, a steel sheet is merely added to the portion PA, and therefore, increasing weight is small. Further, in the countermeasure with respect to the portion PB, only four spot welding points are increased, and therefore, increasing weight is very small. Therefore, in the structure design support device 10, it is possible to more easily detect a portion suitable for increasing the rigidity while suppressing an increase in the weight of a structure.

EXAMPLE 2

In Example 2, an example in which a car body as an example of a structure is analyzed by the structure design support device 10 is shown. In this example, the first state is a non-load state where no load is applied to a car body B. The second state is a load state assuming a situation of turning a curve. FIG. 14 shows the second state in Example 2. The second state in this example is a state where torsion around an axis in a vehicle length direction is applied to a front strut and a rear damper mount is fixed.

Figure 15:
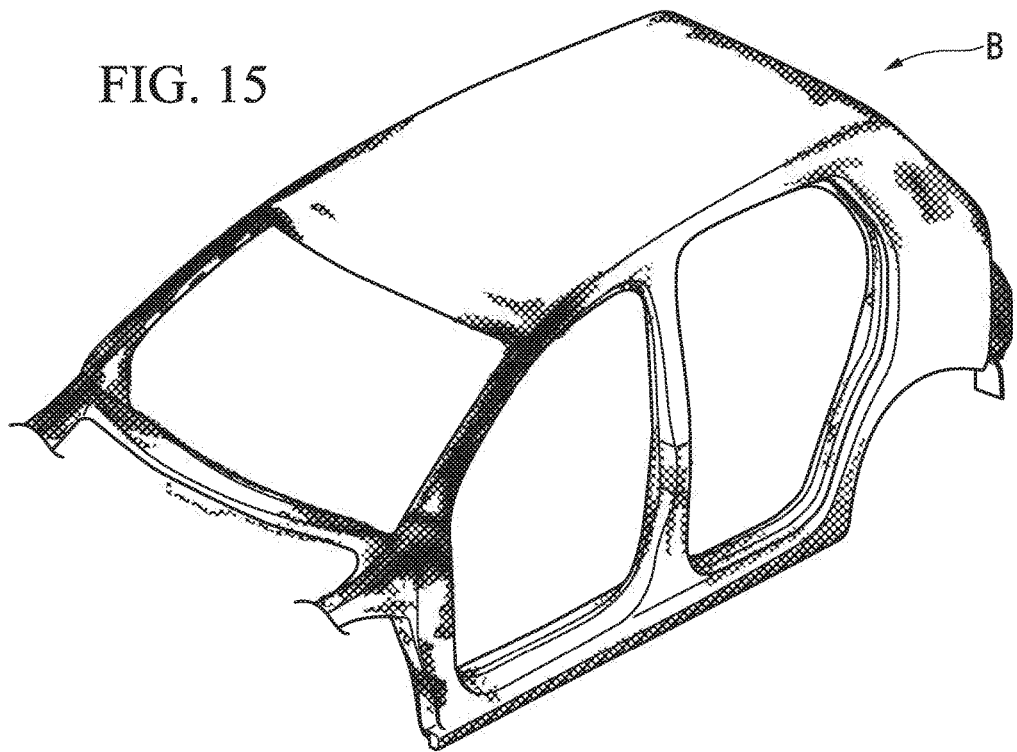
FIG. 15 is a diagram in which strain energy density when being in the second state is plotted by shading, as a comparative example with respect to the same example.

FIG. 15 is a diagram in which the strain energy density when being in the second state is plotted by shading, as a comparative example. The greater the strain energy density, the thicker the shading becomes. The strain energy density is concentrated in an A pillar and a portion of a C pillar.

Figure 16:
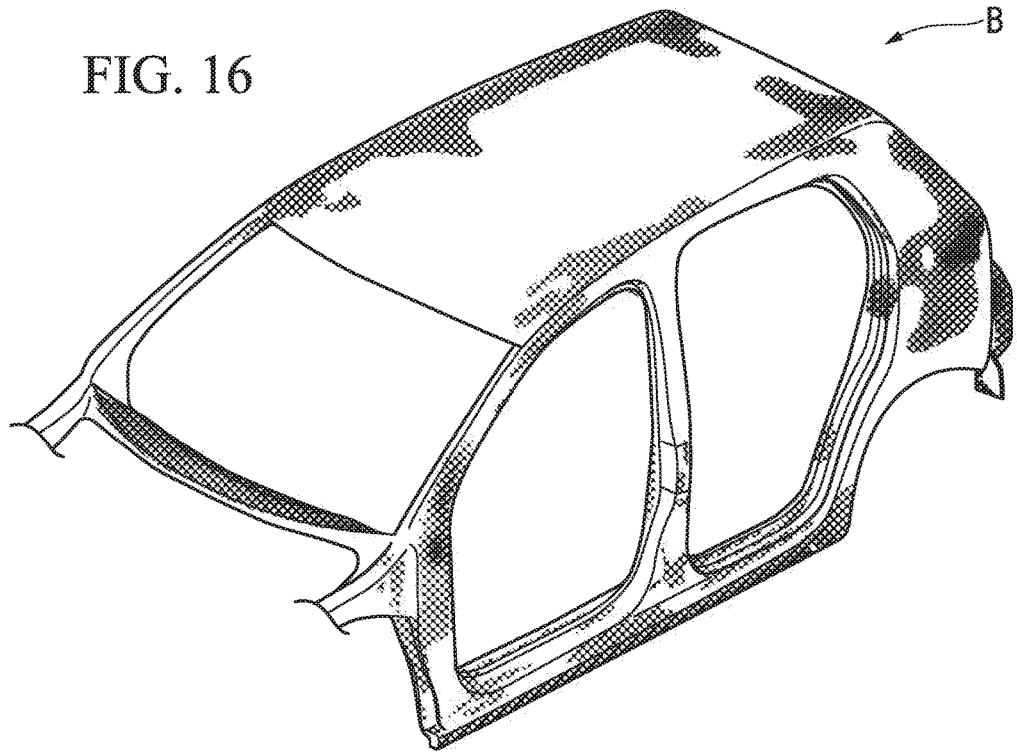
FIG. 16 is a diagram showing a display example by the structure design support device 10 in the same example.

FIG. 16 is a diagram showing a display example by the structure design support device 10. The display example of FIG. 16 is a display example when the structure design support device 10 performs and displays an analysis with respect to the car body B when the first state is the non-load state and the second state is the load state shown in FIG. 14. As shown in FIG. 16, in the C pillar, the evaluation value $E_i$ has a larger value at a portion further on the rear side than the portion in which the strain energy density is large in FIG. 15.

Figure 17:
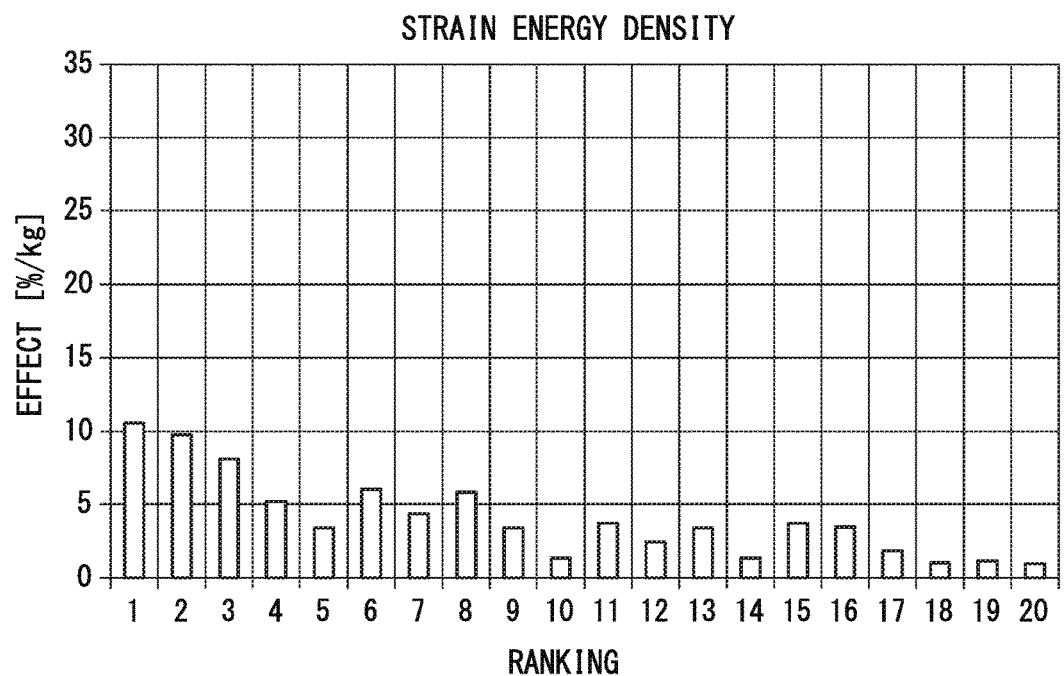
FIG. 17 is a graph showing the effects when a countermeasure has been implemented based on the strain energy density, as a comparative example with respect to the same example.
Figure 18:
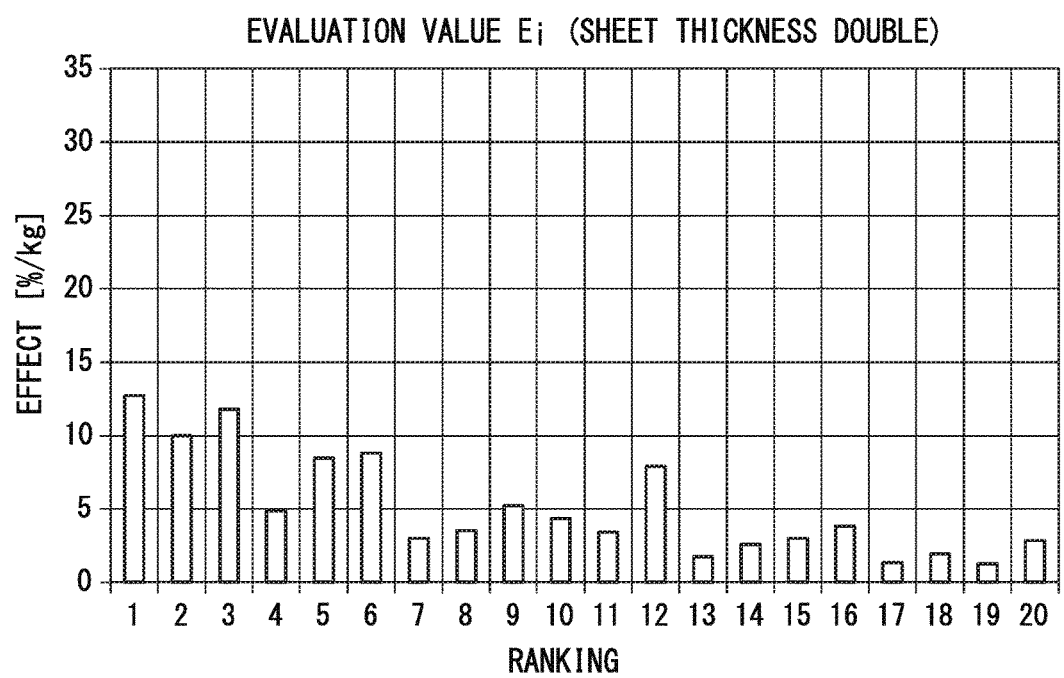
FIG. 18 is a graph showing the effects when a countermeasure to double a sheet thickness has been implemented based on the analysis result by the structure design support device 10 in the same example.

FIG. 17 is a graph showing the effects when a countermeasure has been implemented based on the strain energy density. FIG. 18 is a graph showing the effects when a countermeasure to double a sheet thickness has been implemented based on the analysis result by the structure design support device 10. In FIG. 17, the horizontal axis is a ranking from the side on which the strain energy density is high. In FIG. 18, the horizontal axis is a ranking from the side on which the evaluation value $E_i$ is high. The effect is a value (%/kg) obtained by dividing the amount of improvement (%) of rigidity when doubling the sheet thickness of the portion of the ranking, by mass (kg) increased by doubling the sheet thickness.

Compared to FIG. 17 which is a comparative example with respect to this example, in FIG. 18, greater effects are obtained in many rankings.

Figure 19:
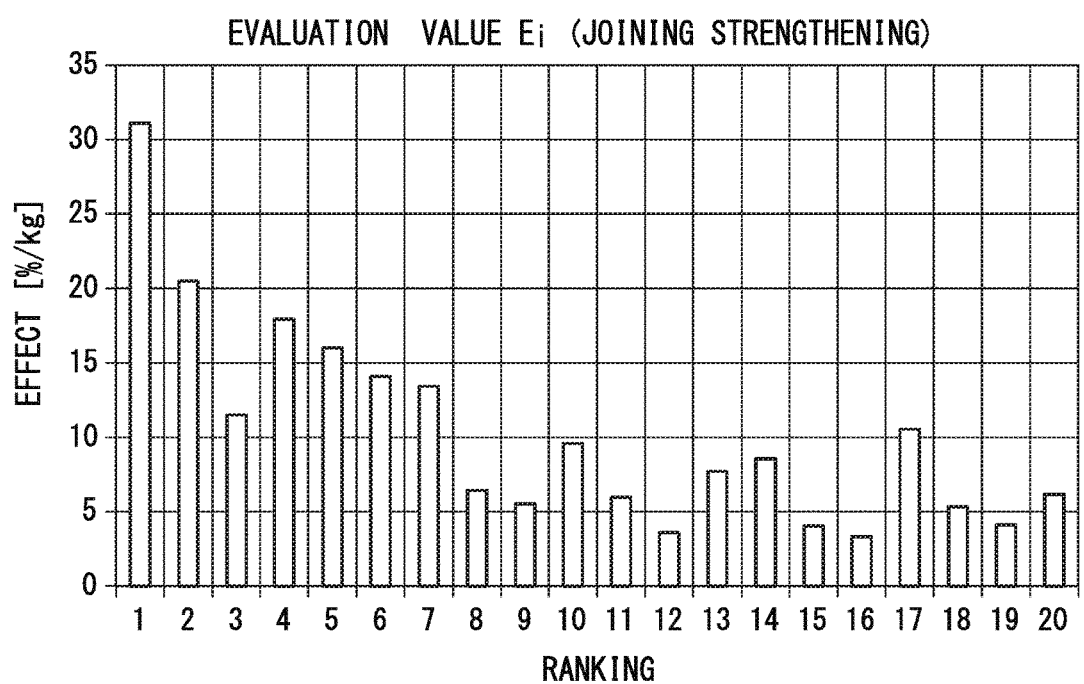
FIG. 19 is graph showing the effects when a countermeasure to strengthen joining has been implemented based on the analysis result by the structure design support device 10 in the same example.

Further, FIG. 19 is a graph showing the effects when a countermeasure to strengthen joining has been implemented based on the analysis result by the structure design support device 10. In FIG. 19, the horizontal axis is a ranking from the side on which the evaluation value $E_i$ is high. The effect is a value (%/kg) obtained by dividing the amount of improvement (%) of rigidity when the joining of the portion of the ranking has been strengthened, by mass (kg) increased by strengthening the joining. Comparing FIG. 19 with FIG. 17, greater effects are obtained in almost all rankings. In particular, in the first ranking, an approximately triple effect is obtained, and in the second ranking, an approximately double effect is obtained.

In this manner, by strengthening the portion in which the evaluation value $E_i$ by the structure design support device 10 has a large value, it is possible to efficiently improve the rigidity. Further, by adopting the strengthening of the joining as a method of strengthening the portion in which the evaluation value $E_i$ has a large value, it is possible to more efficiently improve the rigidity. That is, in the structure design support device 10, it is possible to more easily detect a portion suitable for increasing the rigidity while suppressing an increase in the weight of a structure.

EXAMPLE 3

Figure 21:
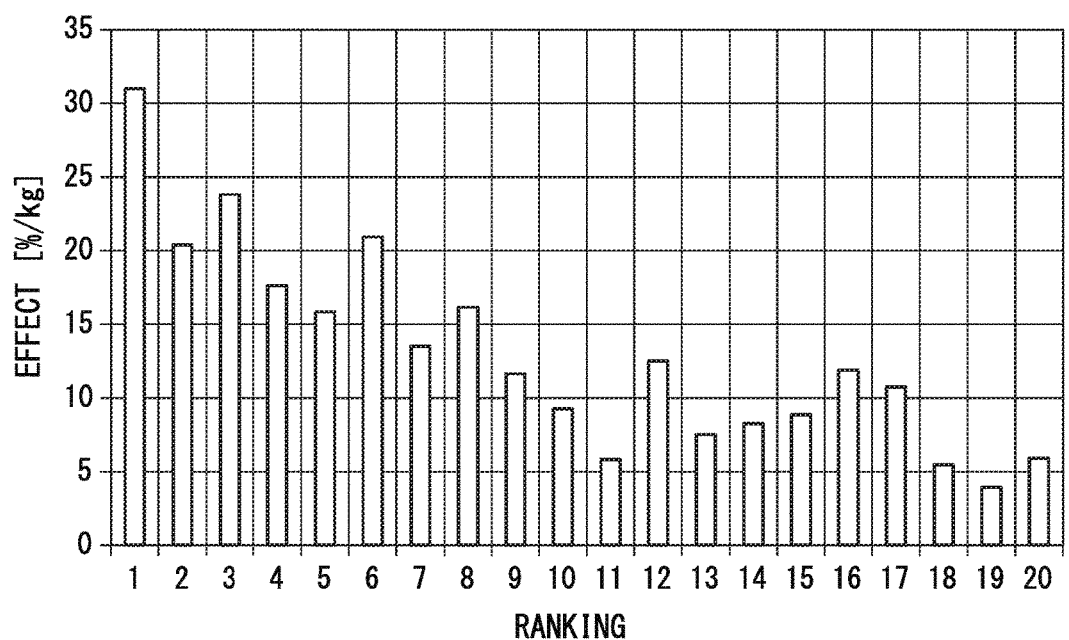
FIG. 21 is a graph showing the effects when a countermeasure to strengthen joining has been implemented based on the analysis result by the structure design support device 10 in Example 3.

In Example 3, similar to Example 2, an example in which a car body as an example of a structure is analyzed by the structure design support device 10 is shown. In this example, in addition to the evaluation using the evaluation value $E_i$ in Example 2, the evaluation point m in which $dF_{i,j}$ is the maximum, among the change rates $dF_{i,j}$ (j=1 to n) used in the calculation of $E_i$ was extracted, and the direction of the evaluation point m in a case where the evaluation point i is set to be the starting point was specified. Then, a part which is located in the direction in which the evaluation point m exists was extracted, and a countermeasure to joining the part to the part which includes the evaluation point i by using a steel sheet having a sheet thickness of 1 mm and a width of 20 mm was implemented. The result is shown in FIG. 21. FIG. 21 is a graph showing the effects when a countermeasure has been implemented based on the analysis result by the structure design support device 10. In a case where FIG. 21 showing the results of this example is compared with FIG. 19 showing the results of Example 2, it can be seen that in this example, greater effects are obtained in many rankings. In particular, in the third ranking and the ninth ranking, an approximately double effect is obtained, in the eighth ranking and the fifteenth ranking, an approximately triple effect is obtained, and in the twelfth ranking and the sixteenth ranking, an approximately fourfold effect is obtained.

EXAMPLE 4

Figure 22:
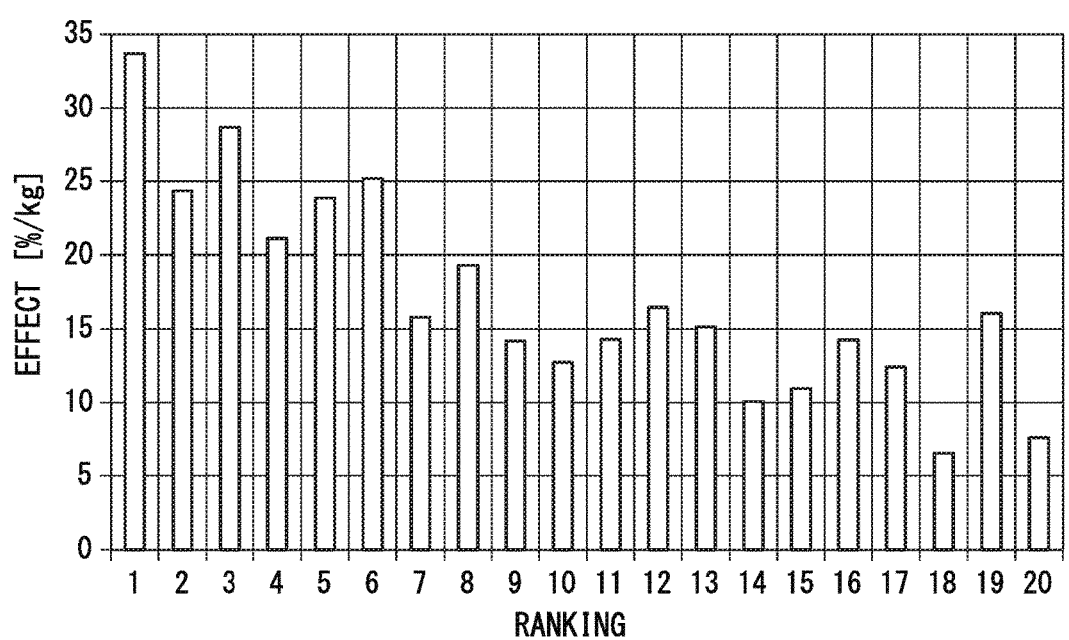
FIG. 22 is a graph showing the effects when a countermeasure to strengthen joining has been implemented based on the analysis result by the structure design support device 10 in Example 4.

In Example 4, similar to Example 2, an example in which a car body as an example of a structure is analyzed by the structure design support device 10 is shown. In this example, in addition to the evaluation using the evaluation value $E_i$ in Example 2, the evaluation point m in which $dF_{i,j}$ is the maximum, among the change rates $dF_{i,j}$ (j=1 to n) used in the calculation of $E_i$ was extracted, and the direction of the evaluation point m in a case where the evaluation point i is set to be the starting point was specified. Further, the relative displacement direction of the part which includes the evaluation point m with respect to the part which includes the evaluation point i was specified before and after the application of a load. Then, when joining the part which includes the evaluation point m to the part which includes the evaluation point i by using a steel sheet having a sheet thickness of 1 mm and a width of 20 mm, the joining was performed such that the longitudinal direction of the joint portion between each part and the steel sheet is parallel to the displacement direction previously specified. The result is shown in FIG. 22. FIG. 22 is a graph showing the effects when a countermeasure has been implemented based on the analysis result by the structure design support device 10.

In a case where FIG. 22 showing the results of this example is compared with FIG. 19 showing the results of Example 2, it can be seen that in this example, greater effects are obtained in many rankings. In particular, in the third ranking, the eleventh ranking, and the thirteenth ranking, an approximately double effect is obtained, in the eighth ranking, the ninth ranking, and the fifteenth ranking, an approximately triple effect is obtained, in the nineteenth ranking, approximately fourfold effect is obtained, and in the twelfth ranking and the sixteenth ranking, an approximately fourfold effect is obtained.

Further, also in a case where FIG. 22 showing the results of this example is compared with FIG. 21 showing the results of Example 3, it can be seen that in this example, greater effects are obtained in many rankings. In particular, in the eleventh ranking and the thirteenth ranking, an approximately double effect is obtained, and in the nineteenth ranking, an approximately fourfold effect is obtained.

Further, the structure design support device 10 may be realized by recording a program for realizing the functions of the structure design support device 10 in FIG. 1 in a computer-readable recording medium, reading the program recorded in the recording medium into a computer system, and executing the program. The "computer system" as referred to herein is intended to include an OS or hardware such as peripheral equipment.

Further, the "computer system" is intended to include a homepage providing environment (or a display environment) as well, if it is a case of utilizing a WWW system.

Further, the "computer-readable recording medium" refers to a portable medium such as a flexible disk, a magneto-optical disk, a ROM, or a CD-ROM, or a storage device such as a hard disk built in a computer system. Further, the "computer-readable recording medium" is also intended to include a medium that dynamically retains a program for a short period of time, as in a communication line in a case of transmitting a program through a network such as the Internet, or a communication line such as a phone line, or a medium that retains a program for a certain period of time, like a volatile memory in a computer system serving as a server or a client at that case. Further, the above-described program may be a program for realizing some of the functions described above, or may be a program capable of realizing the above-described functions in combination with a program already recorded in a computer system.

The embodiment of the present invention has been described above in detail with reference to the drawings. However, the specific configurations are not limited to this embodiment and design changes and the like in a scope which does not depart from the gist of the present invention are also included therein.

INDUSTRIAL APPLICABILITY

The respective aspects of the present invention can be widely applied to a structure design support device, a structure design support method, a program, and a recording medium for performing the evaluation and analysis of a structure at a stage of designing various structures. By the respective aspects of the present invention, it is possible to realize a structure design support device, a structure design support method, a program, and a recording medium, in which it is possible to more easily perform a structural analysis at a stage of a design of a structure, without recourse to trial and error of a designer. Further, according to the respective aspects of the present invention, it is possible to realize a structure design support device, a structure design support method, a program, and a recording medium, in which it is possible to remove noise which is independent of the purpose of an analysis, in a structural analysis at a stage of a design of a structure, without recourse to trial and error of a designer.

BRIEF DESCRIPTION OF THE REFERENCE SYMBOLS

10: structure design support device
11: evaluation point information acquisition unit
12: evaluation point information storage unit
13: evaluation point calculation unit
14: evaluation result display unit

The invention claimed is:

1. A structure design support device for evaluating the rigidity of a structure, comprising:
a first processor which acquires evaluation point information representing a position in a first state and a position in a second state, of an evaluation point provided in the structure which is configured of a plurality of parts, and a part to which the evaluation point belongs, among the plurality of parts; and
a second processor which calculates an evaluation value representing the magnitude of a change between the first state and the second state, of a positional relationship between a first evaluation point belonging to a first part and a second evaluation point belonging to a second part different from the first part to which the first evaluation point belongs, and the first part is joined to the second part, by using the evaluation point information acquired in the first processor, the evaluation value for use to design the structure,
the second processor using the calculated evaluation value to determine a weak portion in the structure;
the second processor implementing a counter measure at the weak portion of the structure,
wherein an evaluation value $E_i$ is calculated via Expression (4) at an evaluation point j as follows:

$$E_i = \frac{1}{n}\sum_{j=1}^{n}\left|\frac{F1_{i,j} - F0_{i,j}}{F0_{i,j}}f(F0_{i,j}, F1_{i,j} - F0_{i,j})\right| \qquad (4)$$

wherein $F0_{i,j}$ is a distance in the first state between the evaluation point i of the first part and the evaluation point j of the another part,
wherein $F1_{i,j}$ is a distance in the second state between the evaluation point i of the first part and the evaluation point j of the another part,
wherein $f(F0_{i,j}, F1_{i,j}-F0_{i,j})$ is a correction coefficient using a distance before a change in state or a change in distance and
wherein n is an integer greater than 1.

2. The structure design support device according to claim 1, wherein the evaluation value relating to the first evaluation point represents the magnitude of a change between the first state and the second state, of a distance between the first evaluation point and the second evaluation point.

3. The structure design support device according to claim 2, wherein the distance between the first evaluation point and the second evaluation point is less than or equal to a threshold value set in advance.

4. The structure design support device according to claim 3, wherein the evaluation value relating to the first evaluation point is calculated regarding all the second evaluation points which satisfy the condition in which the distance between the first evaluation point and the second evaluation point is 100 mm or less.

5. The structure design support device according to claim 3, wherein calculating the evaluation value includes calculating a distance $F0_{i,j}$ in the first state between the first evaluation point i and the second evaluation point j via Expression (1) as follows:

$$F0_{i,j} = \sqrt{(X_i-X_j)^2+(Y_i-Y_j)^2+(Z_i-Z_j)^2} \qquad (1)$$

wherein $X_i$, $Y_i$ and $Z_i$ are coordinates of the first evaluation point i and $X_j$, $Y_j$ and $Z_j$ are coordinates of the second evaluation point j.

6. The structure design support device according to claim 2, wherein the second evaluation point is an evaluation point belonging to a part determined in advance.

7. The structure design support device according to claim 2, wherein the second processor performs
specification of a part to which an evaluation point in which the evaluation value is the maximum belongs, among a plurality of parts different from a part to which the evaluation point belongs, and
specification of a direction of the part to which an evaluation point in which the evaluation value is the maximum belongs, when being based on a position of the part to which the evaluation point belongs.

8. The structure design support device according to claim 7, wherein the second processor specifies a direction in which the part to which an evaluation point in which the evaluation value is the maximum belongs is displaced when a change from the first state to the second state is made.

9. The structure design support device according to claim 1, further comprising:
an evaluation result display unit which displays the evaluation value calculated in the second processor,
wherein the evaluation result display unit displays a name of the part to which the evaluation point corresponding to the evaluation value belongs.

10. The structure design support device according to claim 1, wherein the structure design support device repeatedly carries out a process of calculating the evaluation value.

11. A structure design support method for evaluating the rigidity of a structure, comprising:
a first process by a first processor, of acquiring evaluation point information representing a position in a first state and a position in a second state, of an evaluation point provided in the structure which is configured of a plurality of parts, and a part to which the evaluation point belongs, among the plurality of parts; and
a second process by a second processor, of calculating an evaluation value representing the magnitude of a change between the first state and the second state, of a positional relationship between a first evaluation point belonging to a first part and a second evaluation point belonging to a second part different from the first part to which the first evaluation point belongs, and the first part is joined to the second part, by using the evaluation point information acquired in the first process, the evaluation value for use to design the structure, the method further including
using the calculated evaluation value to determine a weak portion in the structure; and
implementing a counter measure at the weak portion of the structure,
wherein an evaluation value $E_i$ is calculated via Expression (4) at an evaluation point j as follows:

$$E_i = \frac{1}{n}\sum_{j=1}^{n}\left|\frac{F1_{i,j} - F0_{i,j}}{F0_{i,j}} f(F0_{i,j}, F1_{i,j} - F0_{i,j})\right| \quad (4)$$

wherein $F0_{i,j}$ is a distance in the first state between the evaluation point i of the first part and the evaluation point j of the another part, wherein $F1_{i,j}$ is a distance in the second state between the evaluation point i of the first part and the evaluation point j of the another part,
wherein f ($F0_{i,j}$, $F1_{i,j}-F0_{i,j}$) is a correction coefficient using a distance before a change in state or a change in distance and
wherein n is an integer greater than 1.

12. The structure design support method according to claim 11, wherein the evaluation value relating to the first evaluation point represents the magnitude of a change between the first state and the second state, of a distance between the first evaluation point and the second evaluation point.

13. The structure design support method according to claim 12, wherein the distance between the first evaluation point and the second evaluation point is less than or equal to a threshold value set in advance.

14. The structure design support method according to claim 13, wherein the evaluation value relating to the first evaluation point is calculated regarding all the second evaluation points which satisfy the condition in which the distance between the first evaluation point and the second evaluation point is 100 mm or less.

15. The structure design support method according to claim 12, wherein the second evaluation point is an evaluation point belonging to a part determined in advance.

16. The structure design support method according to claim 12, wherein in the second process,
specification of a part to which an evaluation point in which the evaluation value is the maximum belongs, among a plurality of parts different from a part to which the evaluation point belongs, and
specification of a direction of the part to which an evaluation point in which the evaluation value is the maximum belongs, when being based on a position of the part to which the evaluation point belongs
are performed.

17. The structure design support method according to claim 16, wherein in the second process, a direction in which the part to which an evaluation point in which the evaluation value is the maximum belongs is displaced when a change from the first state to the second state is made is specified.

18. The structure design support method according to claim 11, further comprising:
a third process by a third processor, of displaying the calculated evaluation value and displaying a name of the part to which the evaluation point corresponding to the evaluation value belongs.

19. The structure design support method according to claim 11, wherein a process of calculating the evaluation value is repeatedly carried out by the second process.

20. A non-transitory computer readable medium, storing a program, executable by a processor causing a computer to perform a method for evaluating the rigidity of a structure, comprising:
acquiring by a first processor, evaluation point information representing a position in a first state and a position in a second state, of an evaluation point provided in the structure which is configured of a plurality of parts, and a part to which the evaluation point belongs, among the plurality of parts; and
calculating by a second processor, an evaluation value representing the magnitude of a change between the first state and the second state, of a positional relationship between a first evaluation point belonging to a first part and a second evaluation point belonging to a second part different from the first part to which the first evaluation point belongs, and the first part is joined to the second part, by using the evaluation point information acquired by the first processor, the evaluation value for use to design the structure, the method further including using the calculated evaluation value to determine a weak portion in the structure; and implementing a counter measure at the weak portion of the structure, wherein an evaluation value $E_i$ is calculated via Expression (4) at an evaluation point j as follows:

$$E_i = \frac{1}{n}\sum_{j=1}^{n}\left|\frac{F1_{i,j} - F0_{i,j}}{F0_{i,j}} f(F0_{i,j}, F1_{i,j} - F0_{i,j})\right| \quad (4)$$

wherein $F0_{i,j}$ is a distance in the first state between the evaluation point i of the first part and the evaluation point j of the another part, wherein $F1_{i,j}$ is a distance in the second state between the evaluation point i of the first part and the evaluation point j of the another part, wherein $f(F0_{i,j}, F1_{i,j}-F0_{i,j})$ is a correction coefficient using a distance before a change in state or a change in distance and wherein n is an integer greater than 1.

21. The non-transitory computer readable medium according to claim 20, wherein the evaluation value relating to the first evaluation point represents the magnitude of a change between the first state and the second state, of a distance between the first evaluation point and the second evaluation point.

22. The non-transitory computer readable medium according to claim 21, wherein the distance between the first evaluation point and the second evaluation point is less than or equal to a threshold value set in advance.

23. The non-transitory computer readable medium according to claim 21, wherein the second evaluation point is an evaluation point belonging to a part determined in advance.

24. The non-transitory computer readable medium according to claim 21, wherein the calculating includes
specification of a part to which an evaluation point in which the evaluation value is the maximum belongs, among a plurality of parts different from a part to which the evaluation point belongs, and
specification of a direction of the part to which an evaluation point in which the evaluation value is the maximum belongs, when being based on a position of the part to which the evaluation point belongs.

25. The non-transitory computer readable medium according to claim 24, wherein the calculating specifies a direction in which the part to which an evaluation point in which the evaluation value is the maximum belongs is displaced when a change from the first state to the second state is made.

26. The program according to claim 24, wherein the evaluation value relating to the first evaluation point is calculated regarding all the second evaluation points which satisfy the condition in which the distance between the first evaluation point and the second evaluation point is 100 mm or less.

27. The non-transitory computer readable medium according to claim 20, further causing the computer to function as: an evaluation result display unit which displays the calculated evaluation value and displays a name of the part.

28. The non-transitory computer readable medium according to claim 20, wherein the computer is made to repeatedly carry out a process of calculating the evaluation value.

* * * * *